(12) United States Patent
Namie et al.

(10) Patent No.: US 10,666,201 B2
(45) Date of Patent: May 26, 2020

(54) POWER AMPLIFIER MODULE

(71) Applicant: Murata Manufacturing Co., Ltd., Kyoto (JP)

(72) Inventors: Hisanori Namie, Kyoto (JP); Satoshi Goto, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/154,861

(22) Filed: Oct. 9, 2018

(65) Prior Publication Data
US 2019/0109565 A1   Apr. 11, 2019

(30) Foreign Application Priority Data
Oct. 10, 2017   (JP) .................................. 2017-196541

(51) Int. Cl.
*H03F 3/191*   (2006.01)
*H03F 1/02*   (2006.01)
(Continued)

(52) U.S. Cl.
CPC ......... *H03F 1/0222* (2013.01); *H03F 1/0261* (2013.01); *H03F 1/52* (2013.01);
(Continued)

(58) Field of Classification Search
CPC . H03F 1/0222; H03F 1/52; H03F 1/56; H03F 3/21; H03F 1/0261; H03F 3/245; H03F 3/191; H03F 1/565; H03F 2200/516; H03F 2200/411; H03F 3/19; H03F 2200/451; H03F 1/26
(Continued)

(56) References Cited

U.S. PATENT DOCUMENTS 6,052,029 A  *  4/2000  Uda .................... H03F 1/086
                                                        330/277
6,897,732 B2 *  5/2005  Iwai .................... H03F 1/0266
                                                        330/296

(Continued)

FOREIGN PATENT DOCUMENTS

JP    2006-005643 A    1/2006
JP    2013-524626 A    6/2013
JP    5958483 B2       8/2016

*Primary Examiner* — Khanh V Nguyen
(74) *Attorney, Agent, or Firm* — Pearne & Gordon LLP

(57) ABSTRACT

A power amplifier module includes a first power amplifier circuit configured to output a first amplified signal obtained by amplifying an input signal; a second power amplifier circuit configured to output a second amplified signal obtained by amplifying the first amplified signal; and a matching network connected between the first power amplifier circuit and the second power amplifier circuit. The matching network includes a first capacitor connected in series between the first power amplifier circuit and the second power amplifier circuit, a second capacitor connected in series between the first capacitor and the second power amplifier circuit, a first inductor connected between a point between the first capacitor and the second capacitor and a ground, and a second inductor connected in series between the first power amplifier circuit and the first capacitor.

20 Claims, 12 Drawing Sheets

(51) Int. Cl.
  *H03F 3/21* (2006.01)
  *H03F 1/56* (2006.01)
  *H03F 1/52* (2006.01)
  *H03F 3/24* (2006.01)

(52) U.S. Cl.
  CPC .............. *H03F 1/56* (2013.01); *H03F 1/565* (2013.01); *H03F 3/191* (2013.01); *H03F 3/21* (2013.01); *H03F 3/245* (2013.01); *H03F 2200/411* (2013.01); *H03F 2200/516* (2013.01)

(58) Field of Classification Search
  USPC .................................................. 330/310, 302
  See application file for complete search history.

(56) References Cited

U.S. PATENT DOCUMENTS

| | | | | |
|---|---|---|---|---|
| 6,900,693 B2* | 5/2005 | Sasho | .................. | H03F 1/0266 |
| | | | | 330/133 |
| 7,010,284 B2* | 3/2006 | Liu | ...................... | H03F 1/0205 |
| | | | | 330/103 |
| 7,248,111 B1* | 7/2007 | Xu | ...................... | H03F 1/0205 |
| | | | | 330/133 |
| 7,602,240 B2* | 10/2009 | Gao | ...................... | H03F 1/565 |
| | | | | 330/302 |
| 8,508,299 B2* | 8/2013 | Kawano | ................ | H03F 1/0261 |
| | | | | 330/295 |
| 9,461,602 B2 | 10/2016 | Takenaka et al. | | |
| 10,111,278 B2* | 10/2018 | Tsang | ...................... | H03F 1/565 |
| 2011/0241781 A1 | 10/2011 | Owen et al. | | |
| 2017/0047894 A1 | 2/2017 | Takenaka et al. | | |

\* cited by examiner

POWER AMPLIFIER MODULE

This application claims priority from Japanese Patent Application No. 2017-196541 filed on Oct. 10, 2017. The content of this application is incorporated herein by reference in its entirety.

BACKGROUND

The present disclosure relates to a power amplifier module. In mobile communication terminals, such as cellular phones, a power amplifier circuit is used to amplify the power of a signal to be transmitted to a base station. In recent years, modulation schemes, such as high speed uplink packet access (HSUPA), long term evolution (LTE), and LTE-Advanced, which are high-speed data communication standards, have been adopted in cellular phones. In such communication standards, it is important to reduce a phase shift and an amplitude deviation to increase communication speeds. That is, high linearity is demanded for the power amplifier circuit. Furthermore, in such communication standards, a range (dynamic range) in which the amplitude of a signal changes is widened to increase communication speeds in many cases. To achieve high linearity even in the case of a large dynamic range, a high power-supply voltage is necessary, and the power consumption of the power amplifier circuit tends to increase. Thus, a power amplifier module employing an envelope tracking technique has been studied that promotes an improvement in power gain by controlling a power-supply voltage of the power amplifier circuit in accordance with an amplitude level of an input modulated signal.

In a power amplifier module used in a mobile communication terminal that is driven by a battery, a reduction in power consumption is demanded, whereas power gain with high linearity based on a communication scheme is demanded. For example, Japanese Patent No. 5958483 discloses a power amplifier module employing an envelope tracking technique. The power amplifier module includes, as a matching network for first and second power amplifier circuits, first and second capacitors connected in series with each other, and an inductor connected between a point between the first and second capacitors and a ground.

In general, as a frequency of a signal to be amplified increases, element values of a capacitor and an inductor that are necessary for a matching network decrease. For this reason, when a frequency of an input signal is high, large variations in characteristics of the matching network are caused by variations in the element values of the capacitor and the inductor. Thus, impedance mismatching between matching networks occurs, thereby raising the possibility of a reduction in power gain.

BRIEF SUMMARY

The present disclosure has been made in consideration of such circumstances to provide a power amplifier module that makes it possible to promote an improvement in the power gain caused by impedance mismatching.

A power amplifier module according to one embodiment of the present disclosure includes a first power amplifier circuit configured to output a first amplified signal obtained by amplifying an input signal; a second power amplifier circuit configured to output a second amplified signal obtained by amplifying the first amplified signal; and a matching network connected between the first power amplifier circuit and the second power amplifier circuit. The matching network includes a first capacitor connected in series between the first power amplifier circuit and the second power amplifier circuit, a second capacitor connected in series between the first capacitor and the second power amplifier circuit, a first inductor connected between a point between the first capacitor and the second capacitor and a ground, and a second inductor connected in series between the first power amplifier circuit and the first capacitor.

Embodiments of the present disclosure may provide a power amplifier module that makes it possible to promote an improvement in the power gain caused by impedance mismatching.

Other features, elements, characteristics and advantages of the present disclosure will become more apparent from the following detailed description of embodiments of the present disclosure with reference to the attached drawings.

DETAILED DESCRIPTION

Figure 1:
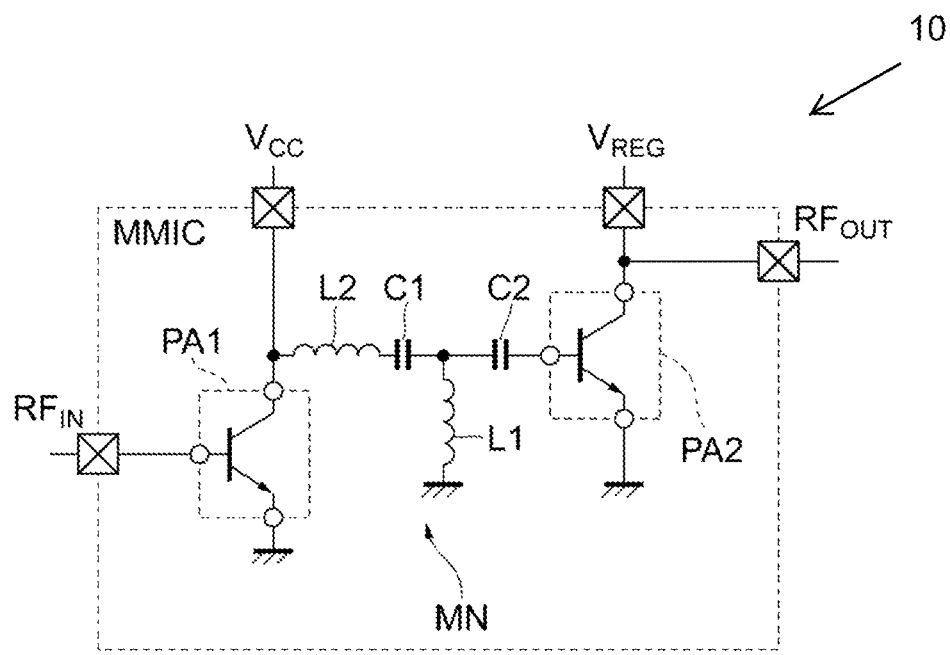
FIG. 1 is a block diagram schematically illustrating a circuit configuration of a power amplifier module according to a first embodiment.

Embodiments of the present disclosure will be described below with reference to the drawings. In second and subsequent embodiments, components that are the same as or similar to those in a first embodiment are denoted by reference numerals that are the same as or similar to those in the first embodiment, and detailed descriptions thereof are omitted as appropriate. With respect to effects obtained in the second and subsequent embodiments, descriptions of effects similar to those in the first embodiment are omitted as appropriate. The drawings of the embodiments are merely an example, and the size and shape of each element are schematically illustrated. An interpretation of the technical scope of the present disclosure limited to the embodiments is not to be made.

First Embodiment

First, a configuration of a power amplifier module 10 according to a first embodiment of the present disclosure will be described with reference to FIG. 1. FIG. 1 is a block diagram schematically illustrating a circuit configuration of a power amplifier module according to the first embodiment.

In a mobile communication terminal, such as a cellular phone, the power amplifier module 10 is a high-frequency module that amplifies the power of a transmission signal to a level necessary to transmit the transmission signal to a base station. A transmission signal herein is a radio frequency (RF) signal modulated by, for example, a radio frequency integrated circuit (RFIC) or the like in accordance with a certain communication scheme.

Although, as an example, the power amplifier module 10 employing an envelope tracking technique will be described below, the power amplifier module 10 is not limited to the envelope tracking (ET) technique. For example, the power amplifier module 10 may employ an average power tracking (APT) technique.

The power amplifier module 10 includes a power amplifier circuit PA1 (first power amplifier circuit), a power amplifier circuit PA2 (second power amplifier circuit), and a matching network MN. The power amplifier circuit PA1, the power amplifier circuit PA2, and the matching network MN are formed on a monolithic microwave integrated circuit (MMIC) chip, which is a single chip. Note that, as described later, some elements constituting the power amplifier module 10 may be formed outside the MMIC chip.

The power amplifier module 10 is composed of two stages of amplifier circuits and outputs an output signal $RF_{OUT}$ obtained by amplifying an input signal $RF_{IN}$. Each of the power amplifier circuits PA1 and PA2 includes a bipolar transistor (for example, a heterojunction bipolar transistor), amplifies an input signal, and outputs the amplified signal. Each of the power amplifier circuits PA1 and PA2 is, for example, a common-emitter power amplifier circuit and amplifies a signal input to a base in accordance with a power-supply voltage supplied to a collector.

The power amplifier circuit PA1 corresponds to a preceding amplifier circuit. The power amplifier circuit PA1 receives supply of a power-supply voltage $V_{CC}$ (for example, a battery voltage or regulator voltage) of a certain level to amplify an input signal $RF_{IN}$, and outputs a first amplified signal obtained by amplifying the input signal $RF_{IN}$. The power amplifier circuit PA2 corresponds to a subsequent amplifier circuit. The power amplifier circuit PA2 receives supply of a power-supply voltage $V_{REG}$, which is controlled at a level corresponding to an amplitude level of the input signal $RF_{IN}$, to amplify the first amplified signal, and outputs a second amplified signal obtained by amplifying the first amplified signal. The second amplified signal corresponds to an output signal $RF_{OUT}$.

The matching network MN is provided to achieve impedance matching between the power amplifier circuits PA1 and PA2. The matching network MN is connected between the power amplifier circuits PA1 and PA2, and includes a capacitor C1 (first capacitor), a capacitor C2 (second capacitor), an inductor L1 (first inductor), and an inductor L2 (second inductor). The capacitor C1 is connected in series between the power amplifier circuits PA1 and PA2. The capacitor C2 is connected in series between the capacitor C1 and the power amplifier circuit PA2. The inductor L1 is connected between a point (also known as a "node") between the capacitors C1 and C2 and a ground. The inductor L2 is connected in series between the power amplifier circuit PA1 and the capacitor C1. The inductor L2 enables an increase in the impedance of the matching network MN. Thus, in the case where the power amplifier module 10 is caused to operate with the envelope tracking technique, a reduction in noise can be expected.

In the case where the inductors L1 and L2 are provided on the MMIC chip, the inductors L1 and L2 are formed with a wiring pattern of the MMIC chip, for example. In embodiments to be described, inductors provided on the MMIC chip are similarly formed with a wiring pattern of the MMIC chip. Note that each inductor may be formed with an inductor element mounted outside the MMIC chip. Furthermore, each inductor may be formed with a bonding wire connecting the MMIC chip to an external substrate or may be formed with a wiring pattern of the external substrate.

There is concern about an increase in insertion loss when the inductor L2 is connected in series with the capacitor C1 of the matching network MN, and thus a series connection of the inductor L2 with the capacitor C1 has not been studied. On the other hand, in the case where the matching network MN does not include the inductor L2, when a frequency of the first amplified signal is high, element values of the capacitor C1 and the inductor L1 that are used have to be reduced for impedance matching. However, when the element value of the inductor L1 is small, the sensitivity of impedance conversion to variations in the element values increases, thereby making it difficult to achieve conversion to an intended impedance. Thus, when the element value of the inductor L1 is small and there are variations in the element values, impedance matching between an output of the power amplifier circuit PA1 and an input of the power amplifier circuit PA2 is not achieved, thereby increasing the insertion loss of the matching network MN.

The matching network MN according to this embodiment of the present disclosure includes the inductor L2, thereby enabling an increase in the element values of the capacitor C1 and the inductor L1. Thus, the power amplifier module 10 enables a reduction in the sensitivity of impedance conversion to variations in the element values of the inductor L1 and the capacitor C1. From a consideration of adjustments made to element values of the capacitor C1 and the inductors L1 and L2, it has been found that, in the case where a high frequency signal is amplified, an increase in insertion loss due to a reduction in the element value of the inductor L1 is greater than an increase in insertion loss due to a series connection of the inductor L2 with the capacitor C1. That is, a reduction in insertion loss due to an increase in the element value of the inductor L1 due to the inclusion of the inductor L2 is greater than an increase in insertion loss due to the inclusion of the inductor L2. It is clear that, on the whole, the matching network MN enables a reduction in insertion loss. As described above, the matching network MN can achieve impedance matching while reducing the insertion loss of the first amplified signal. As an example, the element value (inductance) of the inductor L2 is larger than the element value (inductance) of the inductor L1.

Figure 2:
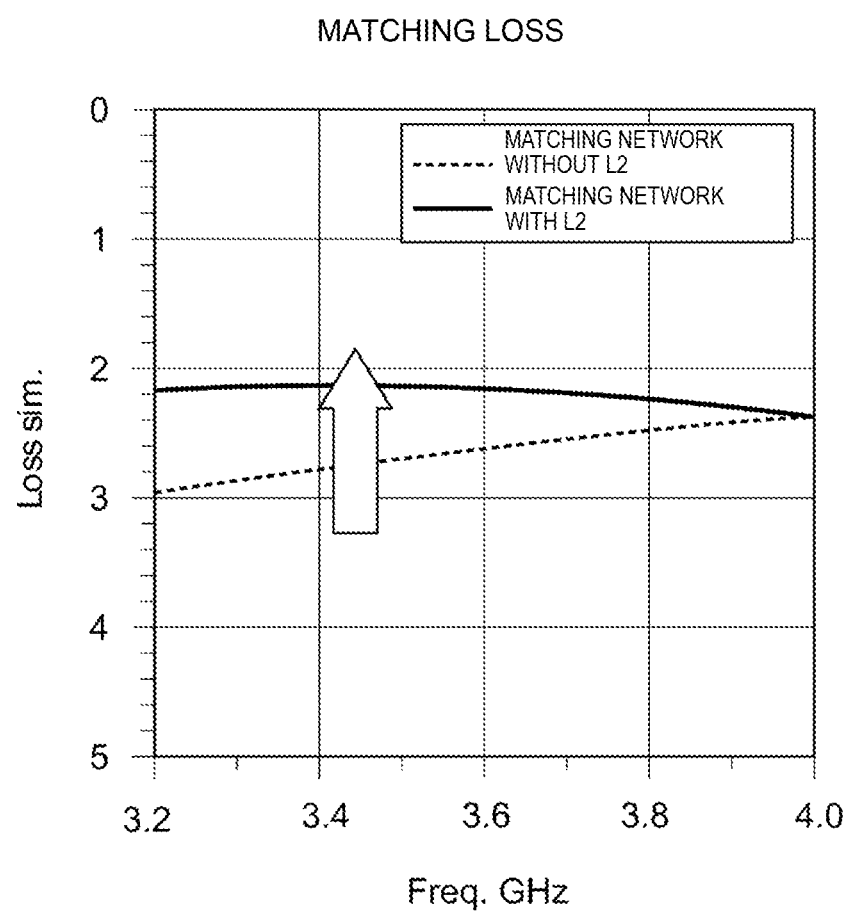
FIG. 2 is a graph illustrating simulation results of insertion losses in matching networks.
Figure 3:
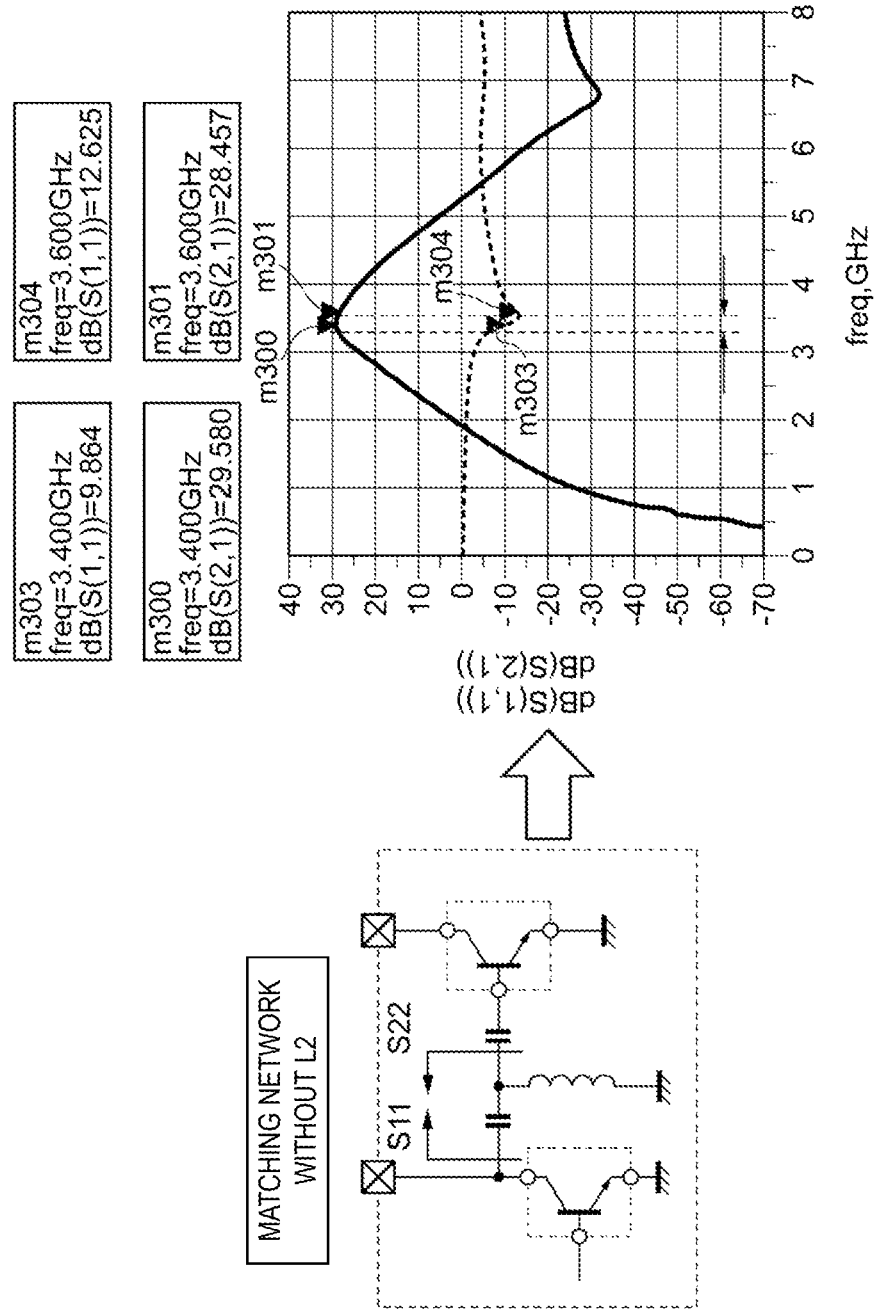
FIG. 3 illustrates an example of frequency characteristics of an amplifier in a matching network without a second inductor (matching network without L2)
Figure 4:
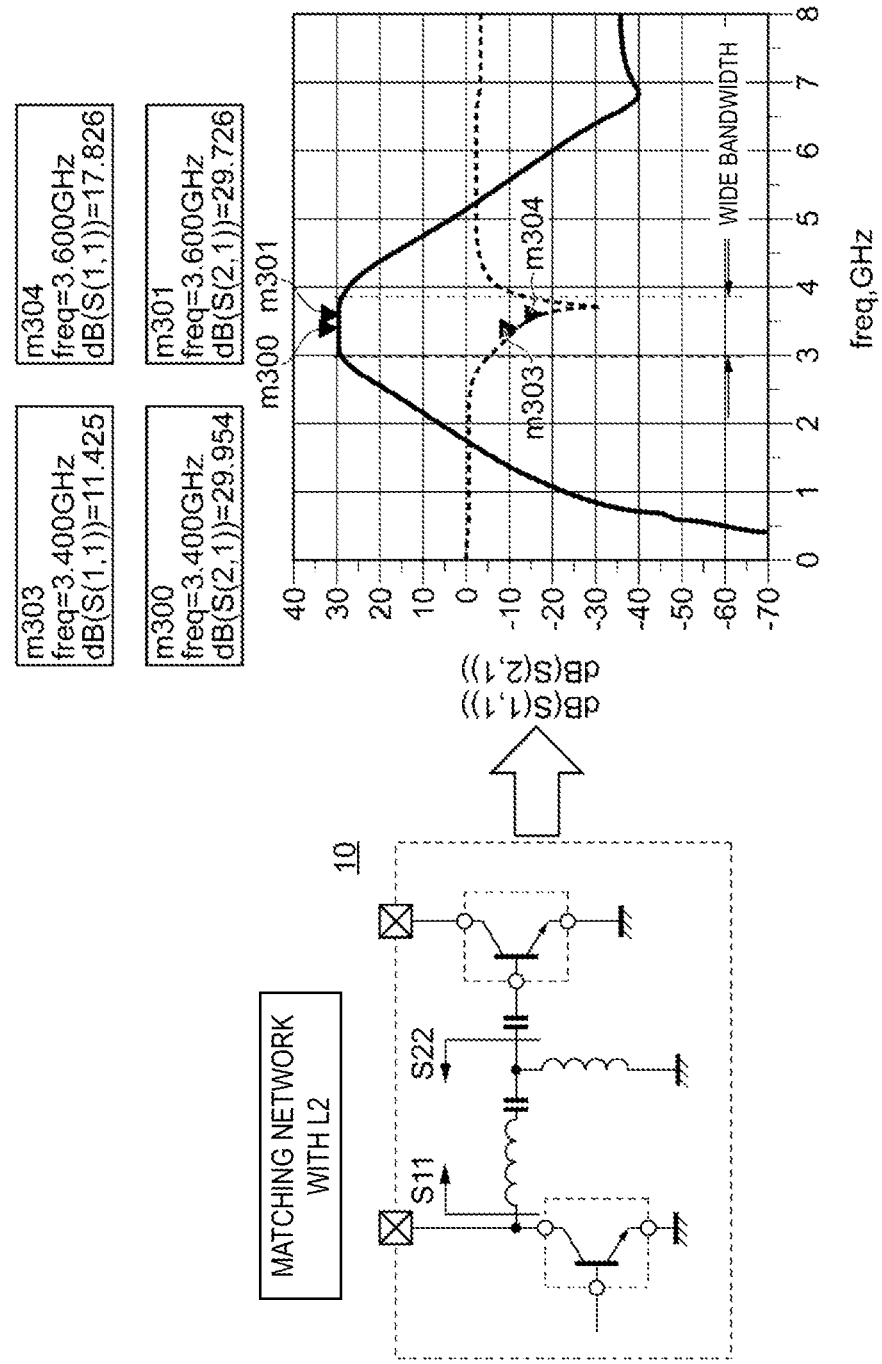
FIG. 4 illustrates an example of frequency characteristics of an amplifier in a matching network with the second inductor (matching network with L2)

Next, characteristics of the matching network MN with the inductor L2 will be described with reference to FIGS. 2 to 4. A description is given in comparison with a matching network without the inductor L2 (matching network without L2). FIG. 2 is a graph illustrating simulation results of insertion losses in matching networks. FIG. 3 illustrates an example of frequency characteristics of an amplifier in a matching network without the second inductor (matching network without L2). FIG. 4 illustrates an example of frequency characteristics of an amplifier in a matching network with the second inductor (matching network with L2). In the graph illustrated in FIG. 2, the horizontal axis represents the frequency of an input signal, and the vertical axis represents the insertion loss in each matching network. In each of the graphs illustrated in FIGS. 3 and 4, the horizontal axis represents the frequency of an input signal, and the vertical axis represents scattering (S) parameters |S(1,1)| and |S(2,1)| in decibels.

As illustrated in FIG. 2, the matching network MN with the inductor L2 enables a reduction in insertion loss in a frequency band (ultra-high band) higher than about 3.0 GHz. When graphs illustrated in FIGS. 3 and 4 are compared with each other, in the matching network without the inductor L2 (matching network without L2), a bandwidth in which the S-parameter |S(2,1)| of the power amplifier reaches a gain exceeding about 29 dB is about 200 MHz. On the other hand, in the matching network MN with the inductor L2, a bandwidth in which the S-parameter |S(2,1)| reaches a gain exceeding about 29 dB is about 1 GHz, and it is found that a wider bandwidth can be achieved in comparison with the matching network without L2. Thus, in comparison with the configuration in which the inductor L2 is not included, the power amplifier module 10 including the matching network MN can achieve high power gain in a wide frequency band. In addition, when the inductor L2 is included, in the case where a power supply connected to the collector of the power amplifier circuit PA1 is a regulator employing the envelope tracking technique, the inductor L2 can prevent an envelope signal leaking from the regulator from leaking into the power amplifier circuit PA2.

Second Embodiment

Figure 5:
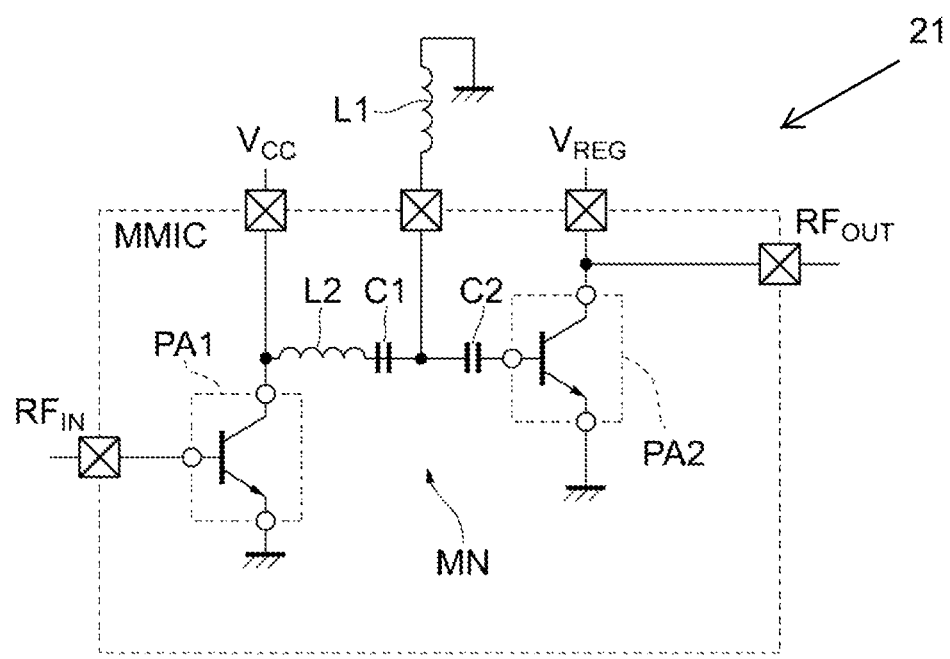
FIG. 5 is a block diagram schematically illustrating a circuit configuration of a power amplifier module according to a second embodiment.
Figure 6:
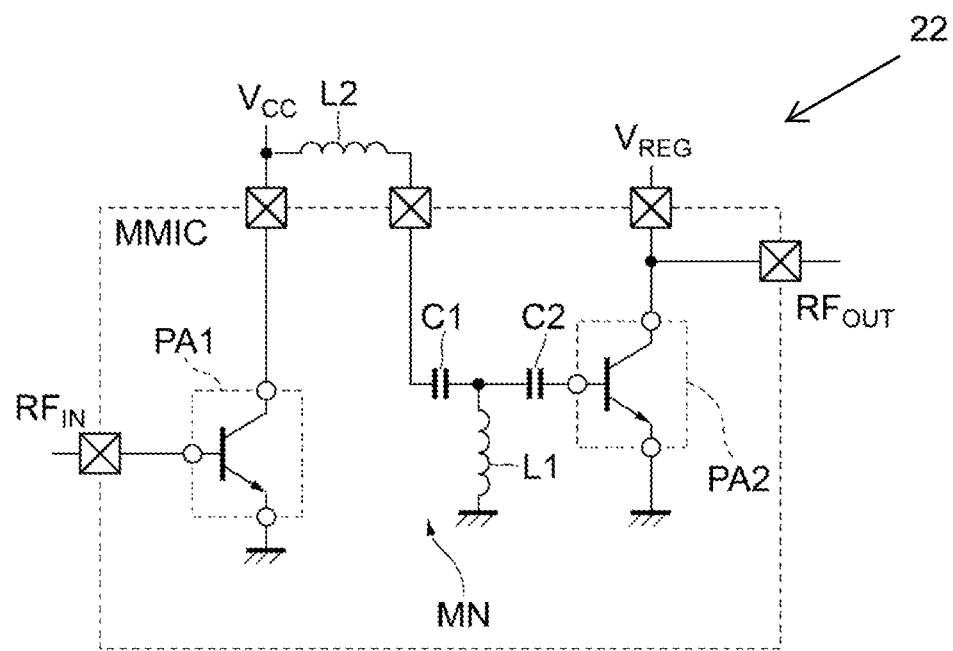
FIG. 6 is a block diagram schematically illustrating another circuit configuration of the power amplifier module according to the second embodiment.
Figure 7:
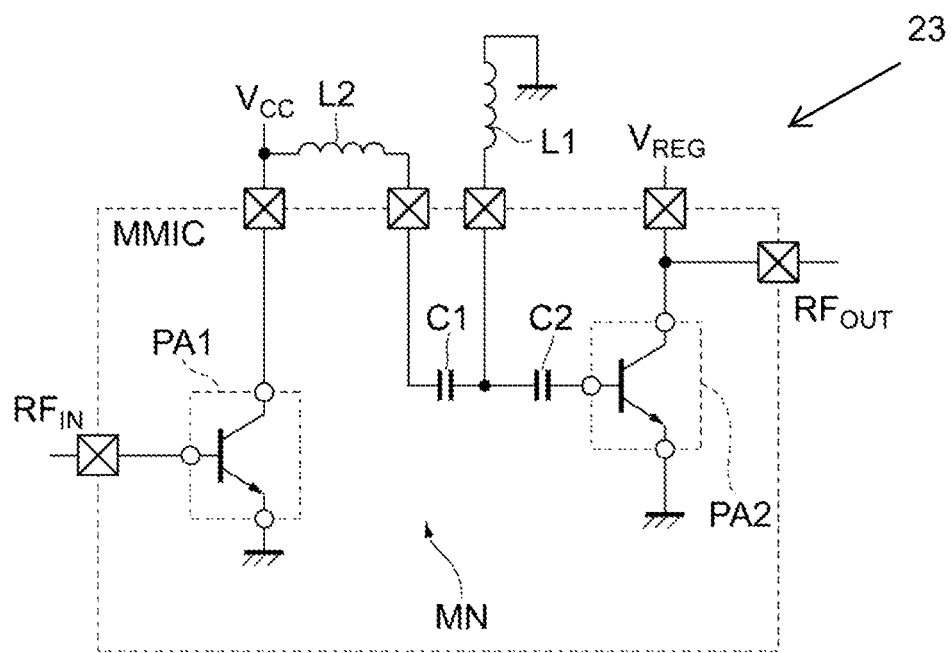
FIG. 7 is a block diagram schematically illustrating still another circuit configuration of the power amplifier module according to the second embodiment.

Next, configurations of power amplifier modules 21, 22, and 23 according to a second embodiment of the present disclosure will be described with reference to FIGS. 5 to 7. FIG. 5 is a block diagram schematically illustrating a circuit configuration of a power amplifier module according to the second embodiment. FIG. 6 is a block diagram schematically illustrating another circuit configuration of the power amplifier module according to the second embodiment. FIG. 7 is a block diagram schematically illustrating still another circuit configuration of the power amplifier module according to the second embodiment.

Each of the power amplifier modules 21, 22, and 23 includes the power amplifier circuits PA1 and PA2, and the matching network MN. Furthermore, the matching network MN included in each of the power amplifier modules 21, 22, and 23 includes the capacitors C1 and C2, and the inductors L1 and L2.

As illustrated in FIG. 5, the power amplifier module 21 differs from the power amplifier module 10 according to the first embodiment in that the inductor L1 is provided outside the MMIC chip. As illustrated in FIG. 6, the power amplifier module 22 differs from the power amplifier module 10 according to the first embodiment in that the inductor L2 is provided outside the MMIC chip. As illustrated in FIG. 7, the power amplifier module 23 differs from the power amplifier module 10 according to the first embodiment in that the inductors L1 and L2 are provided outside the MMIC chip.

With respect to each inductor provided outside the MMIC chip, a bonding wire electrically connecting the MMIC chip to the external substrate is used as an inductor. Alternatively, the inductor is formed with a coil using a wire of the external substrate, or with an inductor element separately mounted on the external substrate, for example. When the inductor is provided outside the MMIC chip, the power amplifier modules 21, 22, and 23 according to the second embodiment can be made smaller in the chip size of the MMIC chip than the power amplifier module 10 according to the first embodiment.

Third Embodiment

Figure 8:
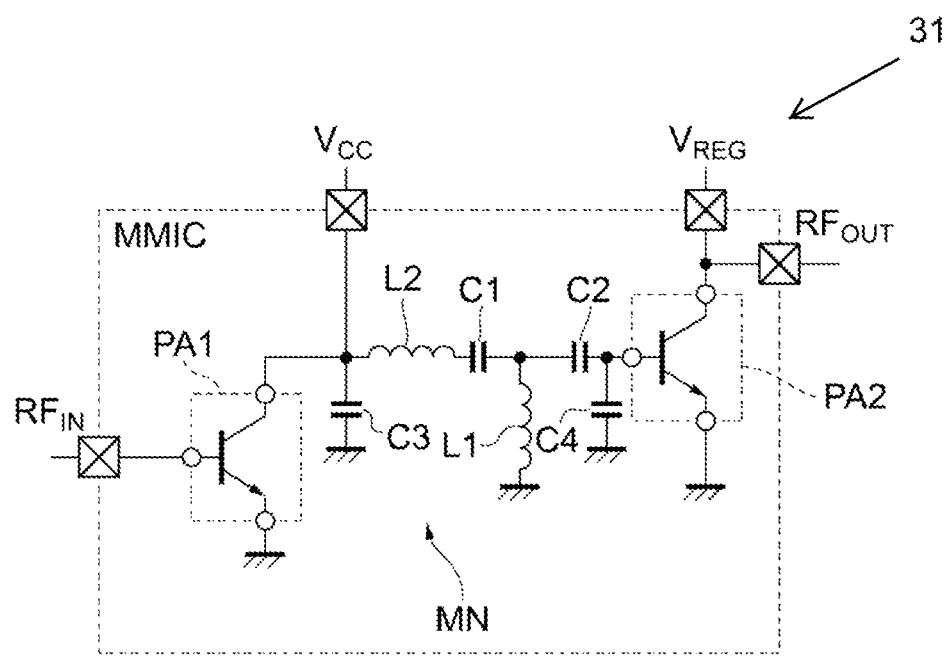
FIG. 8 is a block diagram schematically illustrating a circuit configuration of a power amplifier module according to a third embodiment.

Next, a configuration of a power amplifier module 31 according to a third embodiment of the present disclosure will be described with reference to FIG. 8. FIG. 8 is a block diagram schematically illustrating a circuit configuration of a power amplifier module according to the third embodiment.

The power amplifier module 31 includes the power amplifier circuits PA1 and PA2, and the matching network MN. Furthermore, the matching network MN included in the power amplifier module 31 includes the capacitors C1 and C2, and the inductors L1 and L2.

The power amplifier module 31 differs from the power amplifier module 10 according to the first embodiment in that the matching network MN includes a capacitor C3 (third capacitor) and a capacitor C4 (fourth capacitor). The capacitor C3 is connected between a point between the power amplifier circuit PA1 and the inductor L2 and the ground. The capacitor C4 is connected between a point between the capacitor C2 and the power amplifier circuit PA2 and the ground. As just described, the capacitors C3 and C4 may be included to adjust impedance matching.

Note that one of the capacitors C3 and C4 may be included, and the other may be omitted. Furthermore, as in the power amplifier modules 21, 22, and 23 according to the second embodiment, at least one of the inductors L1 and L2 of the matching network MN may be provided outside the MMIC chip.

Fourth Embodiment

Figure 9:
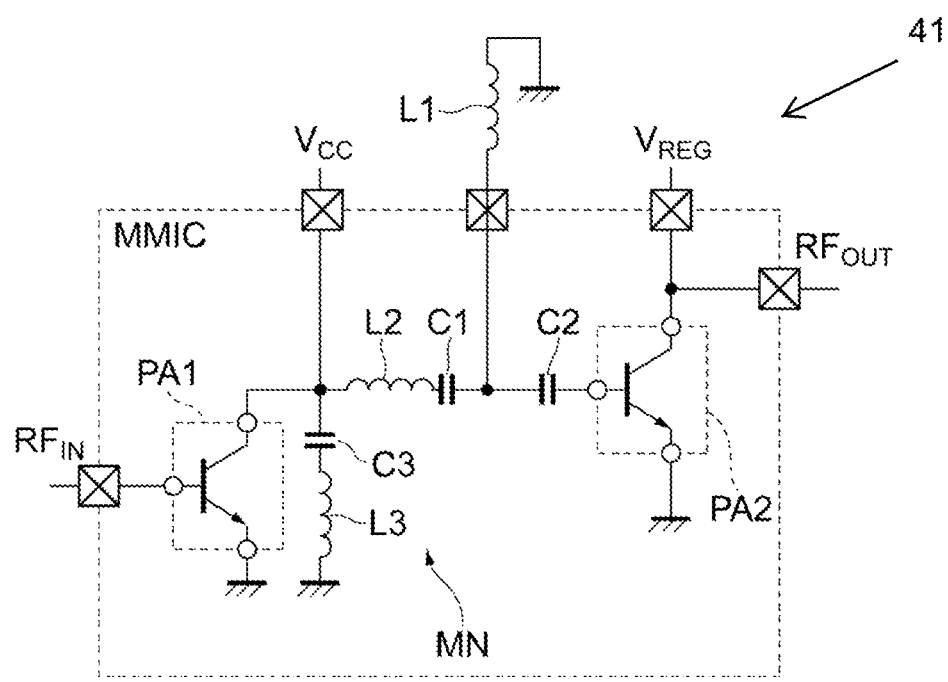
FIG. 9 is a block diagram schematically illustrating a circuit configuration of a power amplifier module according to a fourth embodiment.
Figure 10:
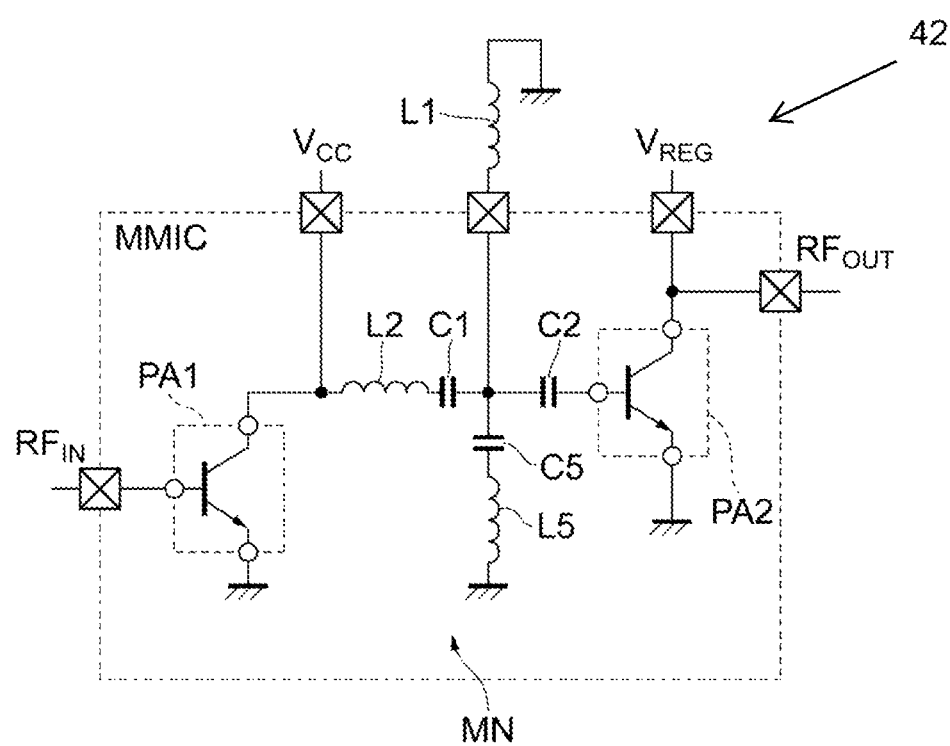
FIG. 10 is a block diagram schematically illustrating another circuit configuration of the power amplifier module according to the fourth embodiment.

Next, configurations of power amplifier modules 41 and 42 according to a fourth embodiment of the present disclosure will be described with reference to FIGS. 9 and 10. FIG. 9 is a block diagram schematically illustrating a circuit configuration of a power amplifier module according to the fourth embodiment. FIG. 10 is a block diagram schematically illustrating another circuit configuration of the power amplifier module according to the fourth embodiment.

Each of the power amplifier modules 41 and 42 includes the power amplifier circuits PA1 and PA2, and the matching network MN. Furthermore, the matching network MN included in each of the power amplifier modules 41 and 42 includes the capacitors C1 and C2, and the inductors L1 and L2.

As illustrated in FIG. 9, the power amplifier module 41 differs from the power amplifier module 10 according to the first embodiment in that the power amplifier module 41 includes the capacitor C3 (third capacitor) and an inductor L3 (third inductor). As illustrated in FIG. 10, the power amplifier module 42 differs from the power amplifier module 10 according to the first embodiment in that the power amplifier module 42 includes a capacitor C5 (fifth capacitor) and an inductor L5 (fifth inductor).

As illustrated in FIG. 9, the capacitor C3 is connected between a point between the power amplifier circuit PA1 and the inductor L2 and the ground. The inductor L3 is connected in series between the capacitor C3 and the ground. The capacitor C3 and the inductor L3 constitute a series resonant circuit and function as a harmonic termination circuit that attenuates a harmonic component included in the first amplified signal output from the power amplifier circuit PA1. Furthermore, as illustrated in FIG. 10, the capacitor C5 is connected between a point between the capacitors C1 and C2 and the ground. The inductor L5 is connected in series between the capacitor C5 and the ground. As in the capacitor C3 and the inductor L3, the capacitor C5 and the inductor L5 also function as a harmonic termination circuit. This makes it possible to attenuate a harmonic component included in the first amplified signal output from the power amplifier circuit PA1. The order in which the capacitor C3 and the inductor L3 are connected is not limited to a particular order as long as the capacitor C3 and the inductor L3 are connected in series, and the capacitor C3 may be connected between the ground and the inductor L3. Similarly, the capacitor C5 may be connected between the ground and the inductor L5. Although not illustrated, the matching network MN may include an inductor L4 (fourth inductor) connected in series with the capacitor C4 illustrated in FIG. 8. At this time, the capacitor C4 and the inductor L4 constitute a series resonant circuit and function as a harmonic termination circuit.

Fifth Embodiment

Figure 11:
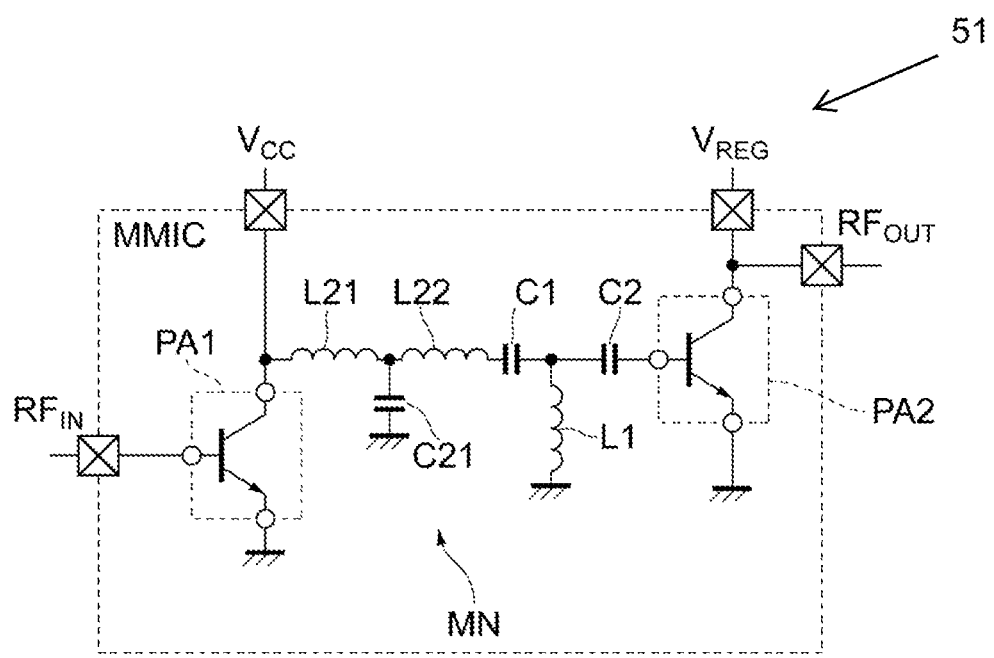
FIG. 11 is a block diagram schematically illustrating a circuit configuration of a power amplifier module according to a fifth embodiment.
Figure 12:
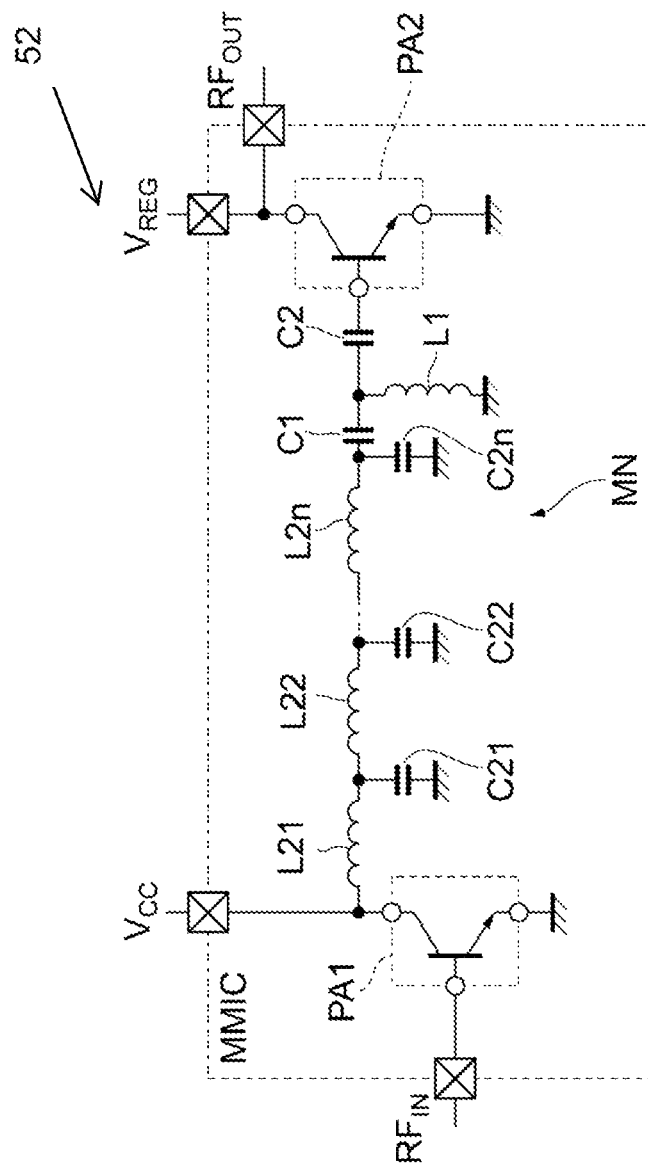
FIG. 12 is a block diagram schematically illustrating another circuit configuration of the power amplifier module according to the fifth embodiment.

Next, configurations of power amplifier modules 51 and 52 according to a fifth embodiment of the present disclosure will be described with reference to FIGS. 11 and 12. FIG. 11 is a block diagram schematically illustrating a circuit configuration of a power amplifier module according to the fifth embodiment. FIG. 12 is a block diagram schematically illustrating another circuit configuration of the power amplifier module according to the fifth embodiment.

Each of the power amplifier modules 51 and 52 includes the power amplifier circuits PA1 and PA2, and the matching network MN. Furthermore, the matching network MN included in each of the power amplifier modules 51 and 52 includes the capacitors C1 and C2, and the inductor L1.

Each of the power amplifier modules 51 and 52 differs from the power amplifier module 10 according to the first embodiment in that a low pass filter (LPF) circuit including the second inductor is provided between the power amplifier circuit PA1 and the capacitor C1.

As illustrated in FIG. 11, the LPF circuit provided in the power amplifier module 51 is constituted by inductors L21 and L22 connected in series between the power amplifier circuit PA1 and the capacitor C1, and a capacitor C21 connected between a point between the inductors L21 and L22 and the ground. One of the inductors L21 and L22 corresponds to the second inductor. As illustrated in FIG. 12, the LPF circuit provided in the power amplifier module 52 is constituted by an n number of inductors L21, L22, . . . , and L2n connected in series between the power amplifier circuit PA1 and the capacitor C1, an n−1 number of capacitors C21, C22, and . . . connected between respective points between adjacent inductors and the ground, and a capacitor C2n connected between a point between the inductor L2n and the capacitor C1 and the ground. Any one of the inductors L21, L22, . . . , and L2n corresponds to the second inductor. In general, as the number of matching elements increases, a frequency band in which impedance matching can be achieved can be increased. Thus, the matching network MN according to the fifth embodiment enables impedance matching to be achieved in a wider bandwidth than the matching network MN according to each of the first to fourth embodiments.

As described above, one embodiment of the present disclosure provides a power amplifier module including a first power amplifier circuit configured to output a first amplified signal obtained by amplifying an input signal; a second power amplifier circuit configured to output a second amplified signal obtained by amplifying the first amplified signal; and a matching network connected between the first power amplifier circuit and the second power amplifier circuit. The matching network includes a first capacitor connected in series between the first power amplifier circuit and the second power amplifier circuit, a second capacitor connected in series between the first capacitor and the second power amplifier circuit, a first inductor connected between a point between the first capacitor and the second capacitor and a ground, and a second inductor connected in series between the first power amplifier circuit and the first capacitor.

The above embodiment makes it possible to reduce insertion loss in the matching network and widen a frequency band in which sufficient gain can be achieved. Furthermore, element values of the first inductor and the first capacitor can be increased, thus enabling a reduction in the sensitivity of changes in characteristics of the matching network to variations in the element values of the first inductor and the first capacitor when a frequency of an input signal is high. Hence, the power gain of the power amplifier module can be improved.

The first inductor may be formed outside a chip on which the first capacitor and the second capacitor are formed. This enables a reduction in the size of an MMIC chip.

The second inductor may be formed outside a chip on which the first capacitor and the second capacitor are formed. This enables a reduction in the size of an MMIC chip.

A third capacitor connected between a point between the first power amplifier circuit and the second inductor and the ground may be further included. That is, the matching network may include the third capacitor to adjust impedance matching.

A fourth capacitor connected between a point between the second capacitor and the second power amplifier circuit and the ground may be further included. That is, the matching network may include the fourth capacitor to adjust impedance matching.

A third inductor connected in series with the third capacitor between the point between the first power amplifier circuit and the second inductor and the ground may be further included. Thus, the third capacitor and the third inductor constitute a series resonant circuit and can function as a harmonic termination circuit that attenuates a harmonic component included in the first amplified signal output from the first power amplifier circuit.

A fourth inductor connected in series with the fourth capacitor between the point between the second capacitor and the second power amplifier circuit and the ground may be further included. Thus, the fourth capacitor and the fourth inductor constitute a series resonant circuit and can function as a harmonic termination circuit that attenuates a harmonic component included in the first amplified signal output from the first power amplifier circuit.

A fifth capacitor and a fifth inductor that are connected in series with each other may be further included, and the fifth capacitor and the fifth inductor may be connected between a point between the first capacitor and the second capacitor and the ground. Thus, the fifth capacitor and the fifth inductor constitute a series resonant circuit and can function as a harmonic termination circuit that attenuates a harmonic component included in the first amplified signal output from the first power amplifier circuit.

A filter circuit may be included that includes a plurality of inductors connected in series between the first power amplifier circuit and the first capacitor, and at least one capacitor connected between a point between adjacent inductors among the plurality of inductors and the ground, and the second inductor may be included in the plurality of inductors. Thus, the matching network can adjust impedance in a wide bandwidth. That is, a frequency band in which the power amplifier module can perform amplification can be widened.

Inductance of the second inductor may be larger than inductance of the first inductor.

A frequency of the input signal may be higher than about 3.0 GHz.

As described above, one embodiment of the present disclosure may provide a power amplifier module that makes it possible to promote an improvement in the power gain caused by impedance mismatching.

The above-described embodiments are intended to facilitate understanding of the present disclosure but not intended for a limited interpretation of the present disclosure. The present disclosure can be changed or improved without departing from the gist of thereof and includes equivalents thereof. That is, things obtained by those skilled in the art making appropriate design changes to the embodiments are also included in the scope of the present disclosure as long as the things have features of the present disclosure. For example, the elements included in the embodiments, and the arrangements, materials, conditions, shapes, sizes, and the like of the elements are not limited to those exemplified in the embodiments, and can be appropriately changed. Furthermore, the embodiments are merely illustrative, and it goes without saying that configurations described in different embodiments can be partially replaced or combined. Such replacement and such combination are also included in the scope of the present disclosure as long as the replacement and the combination have features of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier module comprising:
a first power amplifier circuit configured to output a first amplified signal obtained by amplifying an input signal;
a second power amplifier circuit configured to output a second amplified signal obtained by amplifying the first amplified signal;
a matching network connected between the first power amplifier circuit and the second power amplifier circuit; and
a fourth capacitor,
wherein the matching network comprises:
a first capacitor connected in series between the first power amplifier circuit and the second power amplifier circuit,
a second capacitor connected in series between the first capacitor and the second power amplifier circuit,
a first inductor connected between ground and a node between the first capacitor and the second capacitor, and
a second inductor connected in series between the first power amplifier circuit and the first capacitor, and
wherein the fourth capacitor is connected between ground and a node between the second capacitor and the second power amplifier circuit.

2. The power amplifier module according to claim 1, wherein first capacitor and the second capacitor are formed on a chip, and the first inductor is formed external to the chip.

3. The power amplifier module according to claim 1, wherein the first capacitor and the second capacitor are formed on a chip, and the second inductor is formed external to the chip.

4. A power amplifier module comprising:
a first power amplifier circuit configured to output a first amplified signal obtained by amplifying an input signal;
a second power amplifier circuit configured to output a second amplified signal obtained by amplifying the first amplified signal;
a matching network connected between the first power amplifier circuit and the second power amplifier circuit and
a fifth capacitor and a fifth inductor that are connected in series with each other,
wherein the matching network comprises:
a first capacitor connected in series between the first power amplifier circuit and the second power amplifier circuit,
a second capacitor connected in series between the first capacitor and the second power amplifier circuit,
a first inductor connected between ground and a node between the first capacitor and the second capacitor, and
a second inductor connected in series between the first power amplifier circuit and the first capacitor, and
wherein the fifth capacitor and the fifth inductor are connected between ground and a node between the first capacitor and the second capacitor.

5. The power amplifier module according to claim 1, further comprising:
a third capacitor connected between ground and a node between the first power amplifier circuit and the second inductor.

6. The power amplifier module according to claim 4, further comprising:
a third capacitor connected between ground and a node between the first power amplifier circuit and the second inductor.

7. The power amplifier module according to claim 5, further comprising:
a third inductor connected in series with the third capacitor between the third capacitor and ground.

8. The power amplifier module according to claim 6, further comprising:
a third inductor connected in series with the third capacitor between the third capacitor and ground.

9. The power amplifier module according to claim 1, further comprising:
a fourth inductor connected in series with the fourth capacitor between the fourth capacitor and ground.

10. The power amplifier module according to claim 1, wherein an inductance of the second inductor is larger than an inductance of the first inductor.

11. The power amplifier module according to claim 1, wherein a frequency of the input signal is higher than 3.0 GHz.

12. The power amplifier module according to claim 4, wherein the first capacitor and the second capacitor are formed on a chip, and the second inductor is formed external to the chip.

13. The power amplifier module according to claim 12, wherein an inductance of the second inductor is larger than an inductance of the first inductor.

14. The power amplifier module according to claim 12, wherein first capacitor and the second capacitor are formed on a chip, and the first inductor is formed external to the chip.

15. A power amplifier module comprising:
a first power amplifier circuit configured to output a first amplified signal obtained by amplifying an input signal;
a second power amplifier circuit configured to output a second amplified signal obtained by amplifying the first amplified signal;
a matching network connected between the first power amplifier circuit and the second power amplifier circuit and
a filter circuit,
wherein the matching network comprises:
  a first capacitor connected in series between the first power amplifier circuit and the second power amplifier circuit,
  a second capacitor connected in series between the first capacitor and the second power amplifier circuit,
  a first inductor connected between ground and a node between the first capacitor and the second capacitor, and
  a second inductor connected in series between the first power amplifier circuit and the first capacitor, and
wherein the filter circuit comprises:
  a plurality of inductors including the second inductor, the plurality of inductors being connected in series between the first power amplifier circuit and the first capacitor, and
  at least one capacitor connected between ground and a node between adjacent inductors of the plurality of inductors.

16. The power amplifier module according to claim 15, wherein an inductance of the second inductor is larger than an inductance of the first inductor.

17. The power amplifier module according to claim 15, wherein first capacitor and the second capacitor are formed on a chip, and the first inductor is formed external to the chip.

18. The power amplifier module according to claim 15, wherein the first capacitor and the second capacitor are formed on a chip, and the second inductor is formed external to the chip.

19. The power amplifier module according to claim 15, further comprising:
a third capacitor connected between ground and a node between the first power amplifier circuit and the second inductor.

20. The power amplifier module according to claim 19, further comprising:
a third inductor connected in series with the third capacitor between the third capacitor and ground.

* * * * *

UNITED STATES PATENT AND TRADEMARK OFFICE
CERTIFICATE OF CORRECTION

PATENT NO. : 10,666,201 B2
APPLICATION NO. : 16/154861
DATED : May 26, 2020
INVENTOR(S) : Hisanori Namie It is certified that error appears in the above-identified patent and that said Letters Patent is hereby corrected as shown below:

In the Claims

Column 11, Line 11, Claim 13 "according to claim 12," should read -- according to claim 4, --

Column 11, Line 14, Claim 14 "according to claim 12," should read -- according to claim 4, --

Signed and Sealed this
Twelfth Day of January, 2021

Andrei Iancu
*Director of the United States Patent and Trademark Office*